United States Patent
De Sousa et al.

(10) Patent No.: US 8,019,832 B2
(45) Date of Patent: Sep. 13, 2011

(54) NETWORK CORE ACCESS ARCHITECTURE

(75) Inventors: Jose Teixeira De Sousa, Lisboa (PT); Nuno Calado Correia Lourenco, Lisboa (PT); Nelson Goncalo Do Rosario Ribeiro, Lisboa (PT); Victor Manuel Goncalves Martins, Lisboa (PT); Ricardo Jorge Santos Martins, Lisboa (PT)

(73) Assignee: Coreworks, S.A., Lisbon (PT)

( * ) Notice: Subject to any disclaimer, the term of this patent is extended or adjusted under 35 U.S.C. 154(b) by 347 days.

(21) Appl. No.: 12/121,194

(22) Filed: May 15, 2008

(65) Prior Publication Data
US 2008/0288652 A1 Nov. 20, 2008

(30) Foreign Application Priority Data
May 16, 2007 (PT) .................................. 103744

(51) Int. Cl.
*G06F 15/16* (2006.01)
(52) U.S. Cl. .................... 709/217; 709/230; 709/250
(58) Field of Classification Search ............ 709/217, 709/230, 220, 250
See application file for complete search history.

(56) References Cited

U.S. PATENT DOCUMENTS

| | | | |
|---|---|---|---|
| 6,611,531 B1 | 8/2003 | Chen et al. | |
| 6,993,740 B1 * | 1/2006 | Bergamaschi et al. | 716/12 |
| 7,308,668 B2 * | 12/2007 | Bueti et al. | 716/8 |
| 7,401,315 B2 * | 7/2008 | Duan et al. | 716/16 |
| 2003/0229714 A1 | 12/2003 | Kiremidjian et al. | |
| 2004/0184409 A1 | 9/2004 | Schoenborn et al. | |
| 2006/0215556 A1 | 9/2006 | Wu et al. | |

FOREIGN PATENT DOCUMENTS

WO WO 2005/078465 A1 * 8/2005

* cited by examiner

*Primary Examiner* — Philip B Tran
(74) *Attorney, Agent, or Firm* — Kenealy Vaidya LLP

(57) ABSTRACT

The proposed architecture is integrated in a generic System on Chip (SoC) and can include or consist of an expanded network interface and an infrastructure for accessing Intellectual Property (IP) cores in the system. The architecture enables the system on chip to communicate with a user workstation connected to a communication network. The invention can be used as a simplified network interface for data exchange, which does not require embedded processors and respective software. The invention can be used to temporarily replace the normal data input and output of an IP core with stimuli and responses used for a variety of purposes.

15 Claims, 6 Drawing Sheets

User workstation

System on Chip

| ADDRESS | R/W | DATA |
|---|---|---|
| 0 | | 47 |

Step 1: read the Core ID Register and learn the number of children

Step 2: select the child core by writing the child number to the Child Select Register Step 3: access registers in the child core Step 4: return control to the parent core by writing -1 to the Child Select Register of the child core Single word packet

| 0b | 16b | 32b | 48b | 96b |
|---|---|---|---|---|
| Packet Type | Packet Number | Link ID | Link word | |

Burst packet

| 0b | 16b | 32b | 48b | 96b | 32 + n*48b |
|---|---|---|---|---|---|
| Packet Type | Packet Number | Link ID | Link word 0 | .... | Link word n-1 |

Command packets

| 0b | 16b | 32b |
|---|---|---|
| Packet Type | Packet Number | |

Fig. 10

NETWORK CORE ACCESS ARCHITECTURE

FIELD OF THE INVENTION

This invention relates in general to IP core based System on Chip (SoC) design, verification, test and debug, and in particular to accessing individual IP cores in the SoC for data input and output, configuration, control and observation, over a multi-user communication network.

BACKGROUND OF THE INVENTION

An integrated circuit implementing a complex SoC needs to be accessed for functional and non functional purposes due to a number of reasons namely external configuration, observation and control, maintenance and updates.

SoCs have to adapt to a number of external circumstances, environments and standards. To accomplish this flexibility, configuration registers are used to store configuration values which influence the behavior of IP cores. Moreover, it is often necessary to issue commands while the IP core is working, and to monitor its state; this is normally accomplished by means of control and status registers. Comprehensive information about the state of the system or extensive programming can be obtained by dumping or uploading the entire contents of internal memories.

Previous schemes have been proposed to access integrated circuits for control, observation and configuration purposes. These functions tend to be separate from other communication functions and to use specific pins. Traditional schemes are normally low-speed serial protocols, which avoid using too many chip pins. Well known examples of such schemes include the $I^2C$ bus from Philips [1] or the SPI bus from Motorola [2]. The JTAG standard, initially developed for test purposes, has also become a major chip configuration and verification method and has been standardized by IEEE Std 1149.1 [3].

Field Programmable Gate Arrays (FPGAs) use Joint Test Action Group (JTAG) for chip configuration. Since FPGAs are fully configurable chips, they require massive amounts of configuration data, which, when input using JTAG, take a long time to upload on the chip.

FPGA vendors have developed proprietary configuration methods other than JTAG for providing shorter configuration times. These schemes normally use a parallel interface and load the configuration data from an external PROM, which is less flexible then getting the configuration data from a computer as with JTAG.

A known difficulty with JTAG is when only part of the chip needs to be reconfigured. To solve this problem, FPGA vendors have offered partial reconfiguration schemes which divide the chip in regions and allow reconfiguration of each region. However, these regions have to be large or otherwise the configuration setup overhead is too big. On the other hand $I^2C$ and SPI can be used to read or write small configuration registers but lack the ability to handle large amounts of configuration data.

An even more advanced feature is run-time reconfiguration. In some applications it has been proven advantageous to reconfigure the whole or parts of the chip while the application is running. This improves hardware utilization, saves area and improves performance. Infrastructure for runtime reconfiguration needs to be fast enough so that the reconfiguration time does not impact the computation time significantly. Additionally, reconfiguration needs to occur synchronously to the system clock, which is normally difficult to guarantee as configuration schemes tend to use their own clock domain. Traditional configuration schemes are bad for this purpose since they are slow and use a dedicated serial clock, distinct from the system clock.

With traditional configuration schemes, a configurable device can be programmed via the network if it is attached to a computer which is connected to the network. However, since the traditional configuration schemes are low-speed, any activity which requires data to be sent or received at speed from the device cannot be performed. Such activities include verification, debug, test, rapid partial and runtime configuration.

The schemes mentioned above are meant to access chips. With the current levels of system integration, printed circuit boards have been replaced with SoCs, where components are now embedded cores integrated in single silicon die. Thus, instead of accessing chips the need now arises to access cores inside the SoC. The IEEE 1500 standard is an extension of IEEE 1149 and proposes a means for accessing embedded cores for test. However, its main limitation is the fact that it implements a serial protocol and requires a long scan-chain to be implemented in the SoC. The result is slow stimuli application and response retrieval. Also a scan-chain does not follow the inherently hierarchical structure of digital circuits, and additional mechanisms such as defined in patent application US2003/120986 are needed to work hierarchically with this scheme.

This invention addresses all the problems mentioned above by embedding control, observation and configuration within the chip communication infrastructure itself, using a standard network interface embedded in the system. This way, the communication to the outside of the chip is high-speed serial, whereas the core to core internal communication is lower speed, parallel and memory mapped. Chip control, observation and configuration can be achieved without need for special fixtures and debug equipment such as JTAG pods and cables. Transactions can be achieved at the speed of communication networks, which provides much more bandwidth than traditional access schemes. Partial reconfiguration is facilitated by means of the proposed scheme, since the scheme is hierarchical and the configuration registers are addressable. Runtime reconfiguration is also made easier since the whole system is synchronous. With this invention the IP cores inside an SoC become networked devices in their own right. Thus, they can be directly accessed for verification, testing, field maintenance and firmware updates.

SUMMARY OF THE INVENTION

The proposed architecture is integrated in a generic System on ChipSoC and consists of an expanded network interface and an infrastructure for accessing Intellectual Property (IP) cores in the system. It is used to assist in the development of new IP cores or integration of existing ones, programming or configuring IP cores in the system, verifying the functionality of the integrated IP core, testing the integrated IP core, debugging the integrated IP core, field maintenance and upgrading. The invention can also be used as a simplified network interface for data exchange, which does not require embedded processors and respective software. By providing a networked interface all the activities listed above can be conducted in a collaborative way, enabling geographically distributed teams to carry out their different endeavors simultaneously. The architecture can be used to provide stimuli and observe responses during the development phase of an IP core using a Field Programmable Gate Array (FPGA) based prototyping station. The architecture can be used to program embedded processors over the network or to configure embedded programmable logic devices such as embedded FPGAs. The architecture can be used to set various control registers or observe various status registers in the system. The invention can be used to temporarily replace the normal data input and output of an IP core with stimuli and responses used for functional verification purposes. The architecture can be used to replace the myriad of serial and parallel protocols that exist for different purposes, contributing to unifying input/output methods. The invention can be used to temporarily replace the normal data input and output of an IP core with stimuli and responses used for testing, i.e., to detect the presence of physical fabrication defects. The invention can be used to temporarily replace the normal data input and output of an IP core with stimuli and responses used for exciting and tracing the presence of design errors (bugs). The invention can be used to temporarily replace the normal data input and output of an IP core with stimuli and responses used for diagnosing and fixing problems in the field. The architecture can be used to remotely upgrade the configuration and firmware versions of already deployed systems. The architecture implements parallel IP core access, forming a parallel access tree in the system, rooted in the network interface core. The architecture enables the system on chip to communicate with a user workstation connected to the communication network. The invention provides basic software functions for the user workstation based on standard communication protocols for managing the core access infrastructure and for communicating with the individual IP cores in the SoC.

The proposed architecture is integrated in a generic System on Chip (SoC) and consists of an expanded network interface and an infrastructure for accessing Intellectual Property (IP) cores in the system. The architecture enables the system on chip to communicate with a user workstation connected to a communication network. The invention can be used as a simplified network interface for data exchange, which does not require embedded processors and respective software. The architecture can be used to provide stimuli and observe responses during the development phase of an IP core using a Field Programmable Gate Array (FPGA) based prototyping station. The architecture can be used to program embedded processors over the network or to configure embedded programmable logic devices such as embedded FPGAs. The invention can be used to temporarily replace the normal data input and output of an IP core with stimuli and responses used for a variety of purposes: functional verification; replace the myriad of serial and parallel protocols that exist for different purposes, contributing to unifying input/output methods; testing, i.e., to detect the presence of physical fabrication defects; exciting and tracing the presence of design errors (bugs); diagnosing and fixing problems in the field; remotely upgrade the configuration and firmware versions of already deployed systems. The architecture implements parallel IP core access, forming a parallel access tree in the system, rooted in the network interface core. The invention provides basic software functions based on standard communication protocols, which are run on the user workstation and are used for managing the core access infrastructure and communicating with the individual IP cores in the SoC. By providing a networked interface all the activities listed above can be conducted in a collaborative way, enabling geographically distributed teams to carry out their different endeavors simultaneously.

DETAILED DESCRIPTION OF THE PREFERRED EMBODIMENT

Figure 1:
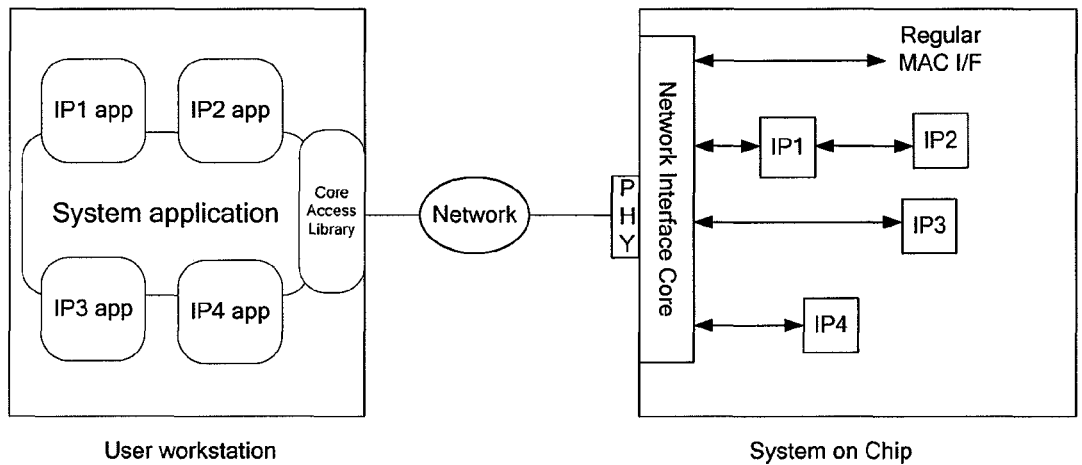
FIG. 1. Overview of the Networked Core Access Technology

FIG. 1 presents a general overview of the invention, which consists of hardware and software components. The hardware component exists on a user SoC and consists of a specially designed Network Interface Core (NIC), and an IP core access tree. The software component runs on a user workstation and consists of a library of core access functions, individual IP core remote software applications, which may be assembled in a complete system application.

This invention allows individual IP cores inside an SoC, not necessarily embedded processors, to be accessed via the communication network. In the preferred embodiment Ethernet will be used, but this invention extends to other network types, provided an equivalent network interface core and equivalent software applications are developed for the network type in question.

During normal operation the NIC can be used like a regular Medium Access Control (MAC) IP connected to an embedded processor, using a regular MAC interface (see FIG. 1). The embedded processor normally implements the upper layers of the protocol stack: the Internet Protocol (IP), Transport Control Protocol (TCP), User Datagram Protocol (UDP), etc.

In a special mode of operation, the core access mode of operation, the NIC communicates with IP cores in the SoC.

In FIG. 1, cores IP1, IP3 and IP4 are directly connected to the NIC. There are N connection pairs to directly connected individual IP cores, where the $i^{th}$ connection pair has the signal sets link_out(i) and link_in(i). The NIC also has an interface to the core or external chip responsible for implementing the physical layer of the protocol—the PHY device as shown in FIG. 1.

The NIC is accessed remotely from a user workstation (computer) where the access architecture software driver is installed. The driver is implemented on top of the UDP protocol, using socket based communication. The most basic functions of the software driver permit sending/receiving information packets to/from a particular core in the SoC, including the NIC itself.

Figure 2:
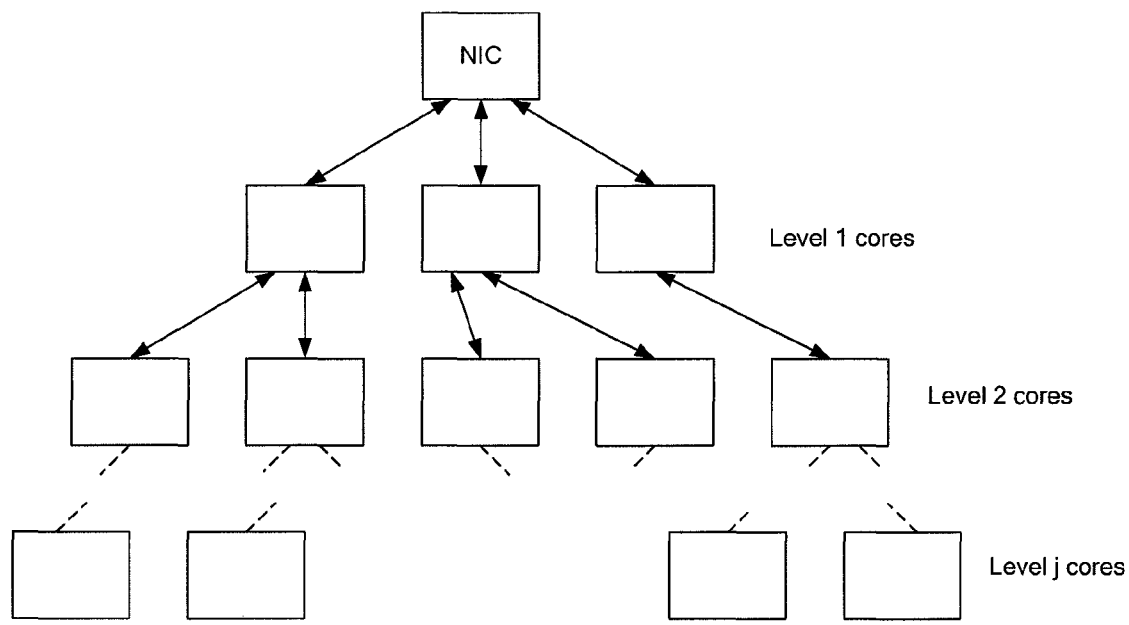
FIG. 2. Core access hierarchy

Some IP cores can communicate indirectly with the NIC. In FIG. 1, core IP2 is indirectly connected to the NIC via core IP1. The access scheme is recursive forming an access tree: cores directly connected to the NIC are called level 1 cores; cores connected to level 1 cores are level 2 cores; in general, cores connected to level j cores are level j+1 cores. It is also preferred that the connection between a level j core and the cores at level j+1 be similar to the connection between the NIC and the cores at level. The access tree is depicted in FIG. 2.

Figure 3:
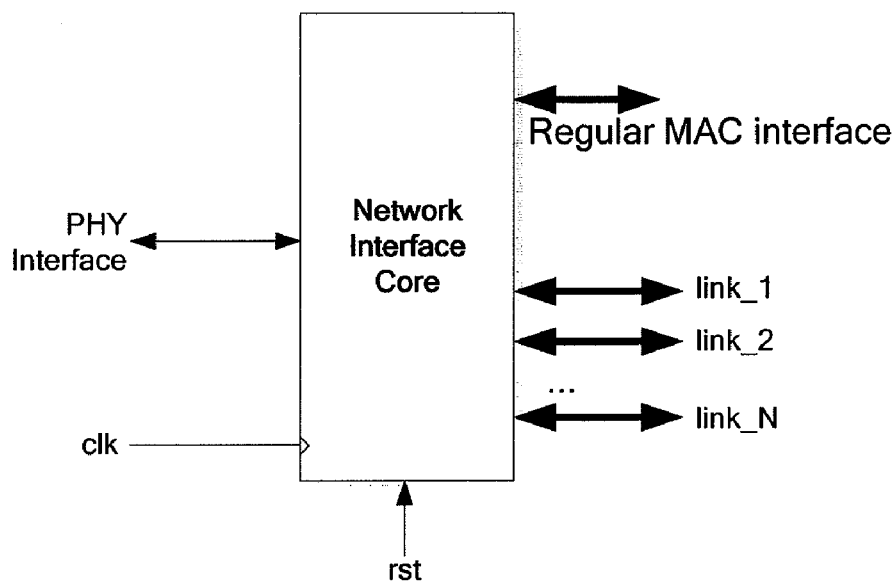
FIG. 3. Simplified external interface of the Network Interface Core
Figure 4:
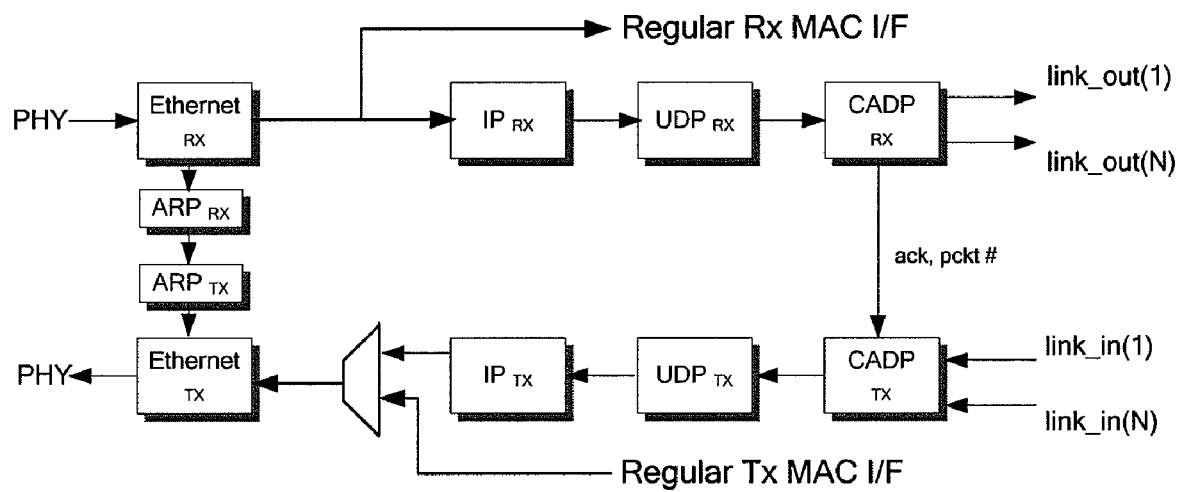
FIG. 4. Block diagram of the preferred Network Interface Core

The external interface of the NIC is shown in FIG. 3, and a simplified block diagram of the NIC is show in FIG. 4.

In both the normal mode and the core access mode, both the Ethernet and the Address Resolution Protocol (ARP) receiver (Rx) and transmitter (Tx) blocks are used.

During normal operation the regular MAC interface is active and the Ethernet packets are routed typically to an embedded processor which implements the upper layers of the protocol stack: UDP/IP, TCP/IP, etc.

In core access mode, the regular MAC interface is disabled and the upper layer protocols are realized in hardware. In the preferred embodiment, hardware blocks to realize simplified versions of the IP and UDP protocols are provided.

This invention adds a special purpose protocol layer, called the Core Access Datagram Protocol, which is implemented by the CADP Rx and Tx blocks as shown in FIG. 4. The CADP Rx block delivers information received from the network to the cores. The CADP Tx block delivers information received from the cores to the network. A systematic description of each block in FIG. 4 is as follows:

Ethernet RX: Link layer module that allows receiving data using the MAC protocol, and the extraction of ARP or IP packets inside the MAC packets. Internally it verifies data integrity through a Cyclic Redundancy Check (CRC).

Ethernet TX: Link layer module that allows transmitting data using the MAC protocol by encapsulating ARP or IP packets in MAC headers. Internally it calculates the Cyclic Redundancy Check (CRC) and appends it to the trailer of the packet being sent.

ARP RX: Link layer module that allows receiving messages using ARP, and detecting the type of message (ARP request or ARP reply). Internally this module maintains a table of two Ethernet addresses indexed by IP addresses, which is consulted by the ARP TX module.

ARP TX: Link layer module that allows sending messages (ARP request or ARP reply) using ARP. These messages are sent upon request from the modules ARP RX (ARP reply messages) and IP TX (ARP request messages).

IP RX: Network layer module that allows receiving data packets using IP and extracting the UDP packets sent as payload of the IP packets. Any other type of payload is ignored.

IP TX: Network layer module that allows sending data packets using IP by inserting IP headers in the UDP packets coming from the module UDP TX.

UDP RX: Transport layer module that allows receiving data packets using UDP, and extracting the corresponding payload, in CADP format. It then passes it over to the CWDP RX module for the last stage of packet reception.

UDP TX: Transport layer module that allows sending data packets using UDP, by inserting UDP headers on the CADP packets coming from the module CWDP TX.

CADP RX: receives data and command packets from the UDP RX module formatted using CADP. This module analyses the CADP fields and does the following: (1) outputs the packet just received to some link_out_i interface and requests the CADP TX module to send the corresponding acknowledge packet; (2) discards and acknowledges retransmitted packets already received; (3) informs the CADP TX module of acknowledge packets received; (4) reacts to specific CADP commands.

CADP TX: sends data and command packets to the UDP TX module formatted using CADP. This module does the following: (1) receives data from the core links and inserts them into a packet of up to 240 link words; (2) sends CADP acknowledge packets when prompted by the CADP RX module; (3) checks acknowledge packets received by the CADP RX module and resends the last packet if the acknowledge packets are wrong or do not arrive within a certain time limit.

Figures 5, 6:
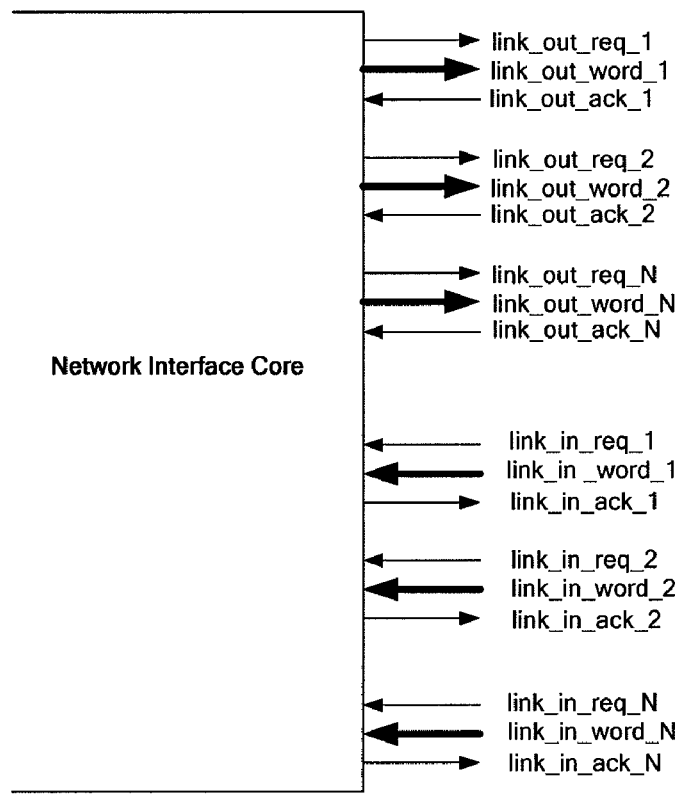
FIG. 5. Detail of the interface between the Network Interface Core and the system cores FIG. 6. Preferred structure of a link word FIG. 7. Detail of the preferred interface of a user core to the Network Interface Core FIG. 8. Accessing registers in child cores FIG. 9. Network protocol stack of the preferred embodiment FIG. 10. Format of the CADP packets

The signals detailed in FIG. 5 are used for information exchange between the NIC and the cores. To output information to a link i, the NIC uses a request signal link_out_req_i, an acknowledge signal link_out_ack_i and a data word link_out_word_i. The data word link_out_word_i is valid only when the request signal link_out_req_i is active. The recipient core should generate the link_out_ack_i acknowledge signal to validate the received data and enable the next word to be received. To input information from a link i, the NIC uses a request signal link_in_req_i, an acknowledge signal link_in_ack_i, and a data word link_in_word_i. The data word link_in_word_i is valid only when the request signal link_in_req_i is active. Since the NIC may be busy sending or re-sending a previous packet, the link_in_ack_i signal is used to acknowledge or not the last input data word. Data bursts in either direction are supported by continuously asserting the acknowledge signal, where the acknowledge signal in one cycle corresponds to the request signal received in the previous cycle.

The preferred structure of a link word is shown in FIG. 6. It consists of three fields: address, read/write (R/W) and data. The only mandatory field is the data field. Address and R/W may be omitted if not needed. Each link views its destination as a set of registers that can be read or written. If the NIC outputs a read request through link_out_i it will place the read address in the address field and assert the R/W signal accordingly. This will cause the core to respond by placing the value of the addressed register in the data field of link_in_i. The size in bits of the address and data fields is not specified and only depends on the needs of the entities exchanging these words.

Figure 7:
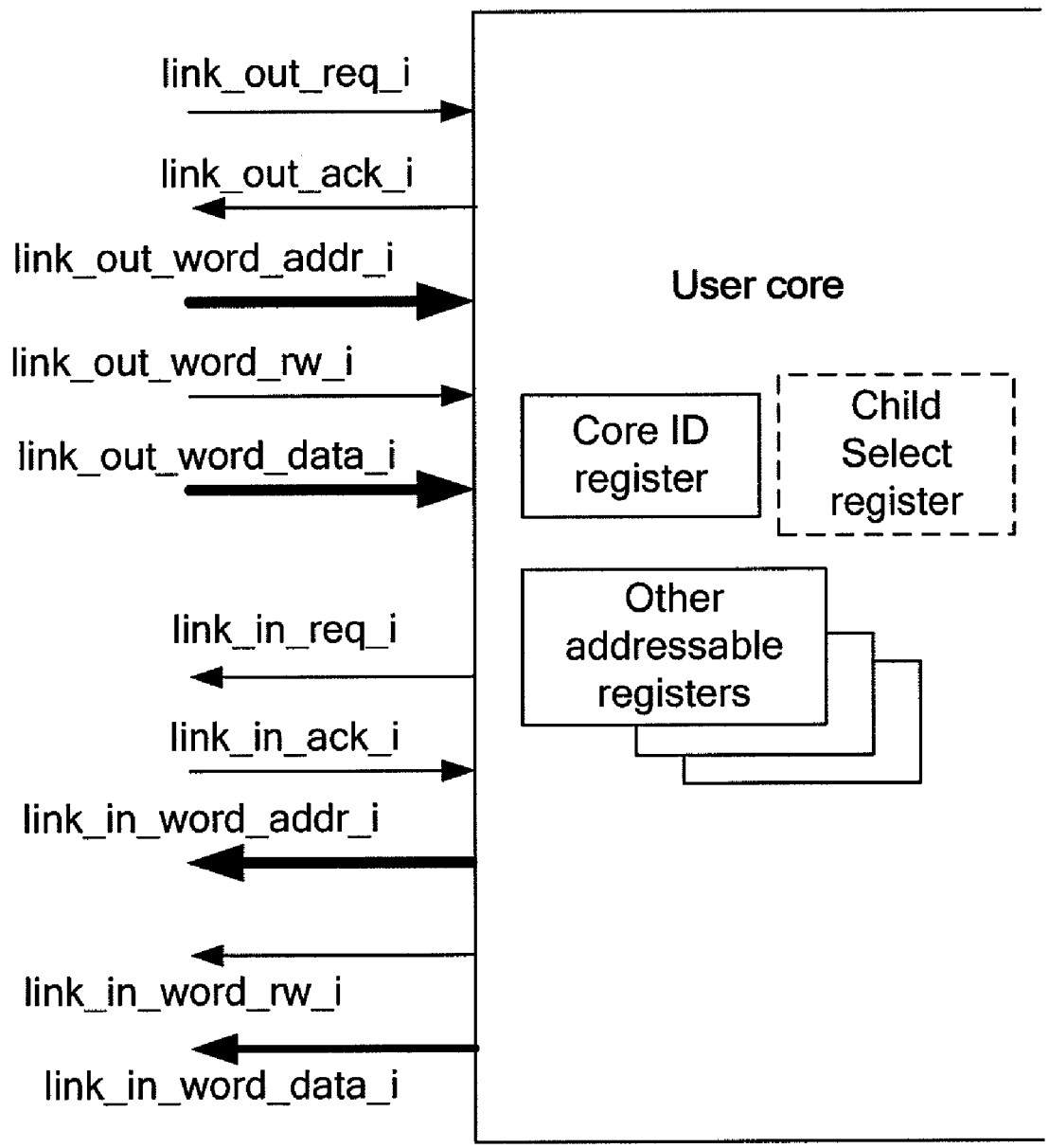

The signals connecting a particular core to the NIC are shown in FIG. 7. The link words arriving and departing from the core have the three recommended fields: address, read/write (R/W) and data. The incoming link can write or request to read different addresses. In case of a read the core returns the read data in the data field of the outgoing link. Outgoing addresses can be used, for example, to distinguish between a response to a received request or a request from the core itself.

Figure 8:
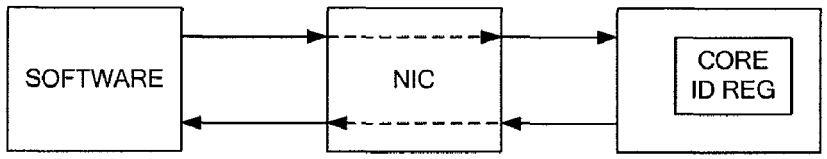
Figure 8:
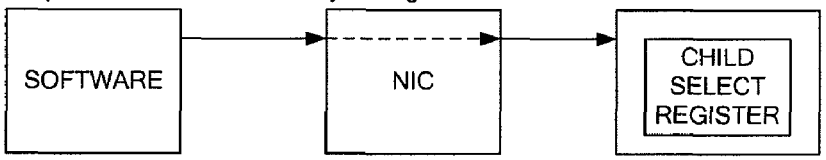
Figure 8:
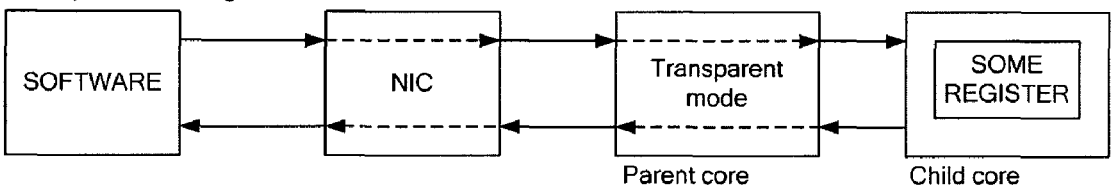
Figure 8:
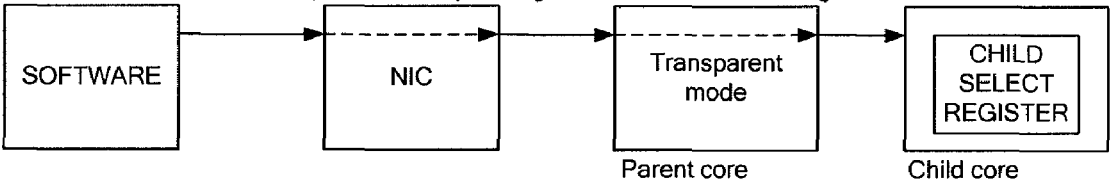

Each core must possess a Core ID Register addressable for reading from a particular link. This register should uniquely identify the core, and the link, in case the core has more than one incoming link. Other non mandatory addressable registers are the following:

1. Control registers: used to receive commands from the core access interface
2. Status registers: used to inform on the core status
3. Configuration registers: used to setup modes of operation to be used for a while
4. Data registers: used to send/receive functional or verification information to/from the cores
5. Any other user registers The Core ID Register shall also inform on the number of child cores connected to it for access purposes. Note that the access scheme being proposed is hierarchical as shown in FIG. 2. In case the core has child cores or a parent core, then it must contain another mandatory writable register: the Child Select Register, used to select the child core to be accessed. The sequence of steps required to access a child core is illustrated in FIG. 8. First the Core ID Register of the parent core is read to learn the number of children. Second the child number is written in the Child Select Register to select the child core to be accessed. Third, from that moment on the NIC is accessing registers in the child core and no longer in the parent core. Fourth, to regain access to the parent core it suffices to write the number −1 in the Child Select Register of the child core itself. From that moment on the NIC is talking again with the parent core. Whether the parent core transparently accesses the child's registers or uses bypass registers to pipeline the accesses to the child core is not specified here.

Figure 9:
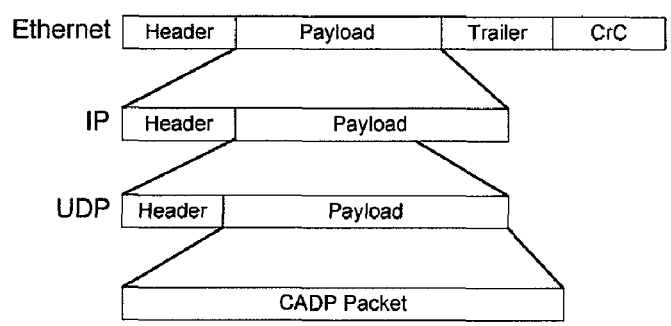

The whole protocol stack is shown in FIG. 9, starting from the Ethernet layer and ending in the CADP layer. The physical layer has been excluded for simplicity. In the Rx path the layers successively strip headers and trailers from the packets, processing the information therein contained, until the information arrives in the cores in the form of link words. In the Tx path, the information sent from the cores in the form of link words passes through the layers, which successively add headers and trailers to the packets.

The possible formats of a CADP packet are shown in FIG. 10. There are currently three packet formats: single word packet, burst packet and command packet. The fields in a CADP packet are explained below:

Packet Number [16 bits]: all packets are numbered to avoid data loss by means of a simple handshake mechanism.

Packet Type [16 bits]: identifies the packet functions, which are currently the following:

Single word packet—contains a single 48-bit link word.
Burst packet—contains up to 240 link words.
Ack packet—informs that the packet whose number is given in the Packet Number field has arrived.
Start comm—enables the NIC for communication placing it in core access mode. This type of packet can only come from the user workstation.
End comm—disables the NIC for communication placing it normal operation mode. This type of packet can only come from the user workstation.

In the future more packet types to implement other functions can be added.

Link ID [16 bits]: identifies the source or destination link.
Link Word [48 bits]: contains the information received from or delivered to the link.

The NIC is accessed remotely from a user workstation (computer) where the NIC software driver is installed. The driver is implemented on top of the UDP protocol, using socket based communication.

The pseudo code of the NIC driver most basic functions is:

```
CADP_send (buffer_out) {
//buffer_out is {packet_type, packet_number, link_id,
link_data};
    while         (!(buffer_in.packet_number    ==
    buffer_out.packet_number &&
                                buffer_in.packet_ty
                                pe == ack)) {
        send (socket, buffer_out);
        while (receive (socket, buffer_in) == 0)
            sleep (TIMEOUT);
    }
    buffer_out.packet_number ++;
}
CADP_receive (buffer_in) {
    while (receive (socket, buffer_in)) {
        if( buffer_in.packet_type != ack )
            break;
        sleep (TIMEOUT) ;
    }
    buffer_out = {ack, buffer_in.packet_number} ;
    send (socket, buffer_out) ;
}
```

This pseudo code has the CADP_send( ) and CADP_receive( ) functions for sending/receiving information packets to/from a particular core in the SoC, including the NIC itself. The CADP_send( ) and CADP_receive( ) functions use the lower level send( ) and receive( ) functions of the operating system, which are based on socket communication and use the popular UDP protocol. The implementation of the ARP, IP and UDP layers in the NIC hardware is what makes it possible to communicate so easily with it using standard operating system calls on a remote workstation. Using a lower level communication protocol is also possible and may save hardware in the NIC. However, it requires intimate knowledge of the network interface adapter of the workstation, which may go beyond the operating system offerings and become, therefore, system dependent. The use of operating system functions guarantees system independence.

The CADP_send( ) function assumes the packet to be transmitted is already formatted and ready in the buffer_out structure. It sends the packet out and waits until it receives the acknowledge packet for that packet: it checks if the received packet is of type ack and if its number corresponds to the packet number sent out. Any other packet types received in the meanwhile are discarded, and after TIMEOUT seconds it attempts to resend the packet. This process is repeated until the acknowledge packet for that packet is received.

The CADP_receive( ) function attempts to receive a packet which is not an acknowledge packet. If it is an acknowledge packet then it is discarded and after TIMEOUT seconds it attempts to receive a non-acknowledge packet again. After managing to receive a non-acknowledge packet the function sends an acknowledge packet for the packet just received.

Higher level NIC driver functions can be built from the basic CADP_send( ) and CADP_receive( ) functions. Some important higher level functions are set_NIC_mode (mode): switches the NIC to core access mode or normal operation mode according to the value of argument mode
list_level1_cores( ): lists the IDs of the cores directly connected to the NIC links
list_children(link_id): lists the IDs of the child cores of the core currently connected to link_i
push_path(link_id, child_link_id): replaces the core currently connected to link_id with its child connected child_link_id
pop_path(link_id): replaces the core currently connected to link_id with its parent
extract_access_tree( ): explores all nodes and branches of the access tree and building a user representation of it.

In the future more advanced functions can be built using the existing library of functions.

REFERENCES

[1] IEEE Std 1149.1 Standard Test Access Port and Boundary-Scan Architecture
[2] Philips Semiconductors, "The I$^2$C Bus Specification", Version 2.1, January 2000.
[3] Motorola, SPI bus specifications
[4] Xilinx, "Architecting Systems for Upgradability with IRL (Internet Reconfigurable Logic)", application note XAPP412, Version 1.0, June, 2001.
[5] IEEE Std 1500 Standard for Embedded Core Test

The invention claimed is:

1. A network core access system for accessing individual functional cores of a system-on-chip, comprising:
a network interface core switchable between:
a medium access control (MAC) IP connection to an embedded processor that is configured to implement other layers of the IP protocol stack, and
an IP core access connection;
one or more functional cores, accessible whether directly, by the said IP core access connection to the network interface core, whether through other functional cores, by further IP core access connections; and a network comprising said MAC IP connection and said IP core access connections;
wherein the network interface core further comprises a direct connection to the core or external chip responsible for implementing the physical layer of the protocol; and
wherein all said connections are parallel, wherein said network is a tree, recursive and hierarchical,
said network interface core (parent core) is connected to said one or more functional cores (child cores),
each functional core of an arbitrary level (parent core) is connected to one of the connected functional cores of the next level (child cores), wherein each functional core has only one parent connection;
wherein said connections further comprise handshake request and acknowledge signals in each direction, and
said functional cores comprise a Child Select Register configured to switch the IP core access connection through a functional core to one of its child cores according to content of said Child Select Register.

2. The system according to claim 1, wherein each of said connections comprises a pair of unidirectional parallel connections or a bidirectional parallel connection.

3. The system according to claim 2, wherein said tree hierarchy follows a chip circuit hierarchy.

4. The system according to claim 1, wherein said functional cores comprise directly addressable configuration registers through said network.

5. The system according to claim 1, wherein said MAC IP connection to an embedded processor is functional and said IP core access connections are non-functional.

6. The system according to claim 5, wherein said network interface core is configured to operate with a clock signal or signals which are the same as a clock signal or signals of the system-on-chip, and comprises an IP stack hardware module for the IP core access connections and for the connection to the physical layer external chip or core.

7. A network core access system for accessing individual functional cores of a system-on-chip, comprising:
a network interface core, having a Child Select Register, and switchable between:
a medium access control (MAC) IP connection to an embedded processor that is configured to implement other layers of the IP protocol stack, and
an IP core access connection;
one or more functional cores, having a Child Select Register, and accessible whether directly, by the said IP core access connection to the network interface core, whether through other functional cores, by further IP core access connections; and
a network comprising said MAC IP connection and said IP core access connections;
wherein the network interface core further comprises a direct connection to the core or external chip responsible for implementing the physical layer of the protocol; and
wherein all said connections are parallel and all said connections are established in a tree, recursively and hierarchically, by:
switching said network interface core (parent core), to one or more functional cores (child cores); and
switching each functional core of an arbitrary level (parent core) to one of the connected functional cores of the next level (child cores), wherein each functional core has only one parent connection;
through:
handshaking request and acknowledge signals in each direction;
selecting and writing in the Child Select Register, of the parent core, a value corresponding to the child core to switch to, therefore placing the parent core in transparent operation; and
selecting and writing in the Child Select Register, of the child core, a special value corresponding to back selecting the parent core, therefore ending the parent core transparent operation.

8. The system according to claim 7, wherein each of said connections comprises a pair of unidirectional parallel connections or a bidirectional parallel connection.

9. The system according to the claim 7, wherein said MAC IP connection to an embedded processor is functional and said IP core access connections are non-functional.

10. The system according to the claim 7, wherein said network interface core is configured to operate with clock signal or signals which are the same as a clock signal or signals of the system-on-chip, and comprises an IP stack hardware module for the IP core access connections and for the connection to the physical layer external chip or core.

11. A method for operating a network core access system for accessing individual functional cores of a system-on-chip, comprising:
switching a connection from a network interface core between:
a medium access control (MAC) IP connection to an embedded processor implementing other layers of the IP protocol stack, and
an IP core access connection to functional cores;
switching a connection between one or more functional cores to the network interface core, whether directly through said IP core access connection, whether through other functional cores by further IP core access connections; and
establishing a direct connection from the network interface core to the core or external chip responsible for implementing the physical layer of the protocol;
wherein all said connections are established through parallel connections, and all said connections are established in a tree, recursively and hierarchically, by:
switching said network interface core (parent core), to one or more functional cores (child cores); and
switching each functional core of an arbitrary level (parent core) to one or more of the connected functional cores of the next level (child cores), wherein each functional core has only one parent connection;
through:
handshaking request and acknowledge signals in each direction;
selecting and writing in a Child Select Register, of a parent core, a value corresponding to the child core to switch to, therefore placing the parent core in transparent operation; and
selecting and writing in a Child Select Register, of a child core, a special value corresponding to back selecting the parent core, therefore ending the parent core transparent operation.

12. The method according to claim 11, further comprising:
accessing said network interface core through a protocol, which comprises packets which comprise the following fields: packet type, packet number, link ID and at least one link word.

13. The method according to claim 11 further comprising:
accessing said functional cores through a protocol, which comprises words which comprise Address, Read/Write and Data fields.

14. The method according to claim 11, comprising the following steps carried out by an external workstation:
   navigating through the access tree;
   discovering functional cores connected to the access tree; and
   publishing the discovered functional cores and allowing applications to communicate with the discovered functional cores.

15. The method according to claim 14, further comprising, by the external workstation, making available a library with the following steps:
   setting an operation mode of the network interface core;
   listing a level of first level cores;
   listing children of a target core;
   getting a complete access tree;
   connecting to a child core; and
   reconnecting with the parent core.

\* \* \* \* \*